United States Patent
Jung et al.

(10) Patent No.: US 12,026,392 B2
(45) Date of Patent: Jul. 2, 2024

(54) MEMORY, MEMORY SYSTEM AND OPERATION METHOD OF MEMORY SYSTEM

(71) Applicant: SK hynix Inc., Gyeonggi-do (KR)

(72) Inventors: Chul Moon Jung, Gyeonggi-do (KR); Woongrae Kim, Gyeonggi-do (KR)

(73) Assignee: SK HYNIX INC., Gyeonggi-do (KR)

( * ) Notice: Subject to any disclaimer, the term of this patent is extended or adjusted under 35 U.S.C. 154(b) by 36 days.

(21) Appl. No.: 17/704,754

(22) Filed: Mar. 25, 2022

(65) Prior Publication Data

US 2023/0161496 A1 May 25, 2023

(30) Foreign Application Priority Data

Nov. 25, 2021 (KR) .................. 10-2021-0164740

(51) Int. Cl.
G06F 3/06 (2006.01)
(52) U.S. Cl.
CPC .......... *G06F 3/0653* (2013.01); *G06F 3/0614* (2013.01); *G06F 3/0632* (2013.01); *G06F 3/0673* (2013.01)
(58) Field of Classification Search
CPC ........ G06F 3/06; G06F 3/0614; G06F 3/0632; G06F 3/0653; G06F 3/0673
See application file for complete search history.

(56) References Cited

U.S. PATENT DOCUMENTS

| | | | |
|---|---|---|---|
| 10,192,608 B2 * | 1/2019 | Morgan | G11C 29/70 |
| 2020/0081631 A1 * | 3/2020 | Schaefer | G06F 3/0629 |
| 2021/0049269 A1 * | 2/2021 | Ghosh | G11C 11/4087 |
| 2021/0057022 A1 * | 2/2021 | Jenkinson | G11C 11/4087 |
| 2021/0264999 A1 | 8/2021 | Bains et al. | |
| 2022/0068364 A1 * | 3/2022 | Ayyapureddi | G11C 11/40615 |
| 2022/0155991 A1 * | 5/2022 | Neudorf | G06F 3/0673 |

FOREIGN PATENT DOCUMENTS

| | | | |
|---|---|---|---|
| KR | 10-2017-0053373 A | 5/2017 | |
| WO | WO-2020050983 A1 * | 3/2020 | G06F 3/061 |
| WO | WO-2020139539 A1 * | 7/2020 | G06F 12/1441 |
| WO | WO-2021206903 A1 * | 10/2021 | G11C 11/4076 |

OTHER PUBLICATIONS

H. Gomez, A. Amaya and E. Roa, "DRAM row-hammer attack reduction using dummy cells," 2016 IEEE Nordic Circuits and Systems Conference (NORCAS), Copenhagen, Denmark, 2016, pp. 1-4.*

(Continued)

*Primary Examiner* — Pierre Michel Bataille
(74) *Attorney, Agent, or Firm* — IP&T GROUP LLP

(57) ABSTRACT

A method for operating a memory system includes: collecting, by a memory controller, information on rows that are determined as row-hammer-attacked in a memory by the memory controller; collecting, by the memory, information on rows that are determined as row-hammer-attacked by the memory; confirming, by the memory, that the row collected by the memory controller is the same as the row collected by the memory; and resetting, by the memory, information on the row collected by the memory which is the same as the row collected by the memory controller in response to the confirmation.

27 Claims, 8 Drawing Sheets

(56) References Cited

OTHER PUBLICATIONS

Z. Zhang, Y. Cheng, D. Liu, S. Nepal, Z. Wang and Y. Yarom, "PThammer: Cross-User-Kernel-Boundary Rowhammer through Implicit Accesses," 2020 53rd Annual IEEE/ACM International Symposium on Microarchitecture (MICRO), Athens, Greece, 2020, pp. 28-41.*

P. Frigo et al., "TRRespass: Exploiting the Many Sides of Target Row Refresh," 2020 IEEE Symposium on Security and Privacy (SP), San Francisco, CA, USA, 2020, pp. 747-762.*

Zhi Zhang, "SoftTRR: Protect Page Tables Against RowHammer Attacks using Software-only Target Row Refresh," Cryptography and Security (cs.CR); Operating Systems, Feb. 2021.*

Kim et al, "Architecture Support for Mitigating Row Hammering in DRAM Memories", Jan.-Jun. 2015, IEEE Computer Architecture Letters, vol. 14, No. 1, p. 9-12.*

Victor Van Der Veen et al., "Drammer: Deterministic Rowhammer Attacks on Mobile Platforms," In the proceeding of the ACM SIGSAC Conference on Computer and Comunications Security, Oct. 24-28, 2016, pp. 1675-1689, Vienna, Austria.*

J. Woo and K.-S. Chung, "Mitigating Row-hammering by Adapting the Probability of Additional Row Refresh," 2019 IEEE 4th International Conference on Technology, Informatics, Management, Engineering & Environment (TIME-E), Bali, Indonesia, 2019, pp. 37-42.*

S. M. Seyedzadeh, A. K. Jones and R. Melhem, "Counter-Based Tree Structure for Row Hammering Mitigation in DRAM," in IEEE Computer Architecture Letters, vol. 16, No. 1, pp. 18-21, Jan. 1-Jun. 2017.*

\* cited by examiner

MEMORY, MEMORY SYSTEM AND OPERATION METHOD OF MEMORY SYSTEM

CROSS-REFERENCE TO RELATED APPLICATIONS

The present application claims priority to Korean Patent Application No. 10-2021-0164740, filed on Nov. 25, 2021, which is incorporated herein by reference in its entirety.

BACKGROUND

1. Field

Various embodiments of the present invention relate to a memory system.

2. Description of the Related Art

As the degree of integration of a memory increases, the spacing between a plurality of word lines included in the memory decreases. As the spacing between word lines decreases, the coupling effect between the neighboring word lines increases.

Moreover, whenever data is input to or output from a memory cell, a word line toggles between an active state and an inactive state. As the coupling effect between the neighboring word lines increases, the data in the memory cell coupled to a word line which is disposed adjacent to a frequently activated word line may be damaged. This phenomenon is referred to as row hammering. Since the data of a memory cell is damaged before the memory cell is refreshed due to word line disturbance, there may be an issue with the data.

FIG. 1 is a view illustrating row hammering. FIG. 1 shows a portion of a cell array included in a memory.

In FIG. 1, 'WLL' may correspond to a word line with a large number of activations, and 'WLL−1' and 'WLL+1' may be word lines disposed adjacent to 'WLL', that is, word lines disposed adjacent to the word line with a large number of activations. Also, 'CL' may indicate a memory cell that is coupled to the 'WLL', and 'CL−1' may indicate a memory cell that is coupled to the 'WLL−1', and 'CL+1' may indicate a memory cell that is coupled to the 'WLL+1'. Each memory cell may include a cell transistor TL, TL−1, and TL+1 and a cell capacitor CAPL, CAPL−1, and CAPL+1.

When 'WLL' is activated or deactivated in FIG. 1, the voltages of 'WLL−1' and 'WLL+1' may rise or fall due to the coupling effect occurring between the 'WLL' and the 'WLL−1' and 'WLL+1', which also may affect the amount of charges in the cell capacitors CL−1 and CL+1. Therefore, when the 'WLL' is frequently activated and the 'WLL' toggles between an activated state and a deactivated state, the change in the amount of charges stored in the cell capacitors CAPL−1 and CAPL+1 that are included in the 'CL−1' and the 'CL+1' may increase and the data in the memory cell may be deteriorated.

Also, the electromagnetic wave generated when the word line toggles between the activated state and the deactivated state may damage the data by introducing electrons into the cell capacitor of the memory cell coupled to a neighboring word line or leaking electrons from the cell capacitor.

As a method for solving the problem of row hammering, a method of detecting a row (word line) that has been activated multiple times and refreshing the rows neighboring the row that has been activated multiple times is mainly used.

SUMMARY

Embodiments of the present invention are directed to a technology for increasing the defending capability of a memory against row hammer attacks.

In accordance with an embodiment of the present invention, a method for operating a memory system includes: collecting, by a memory controller, information on rows that are determined as row-hammer-attacked in a memory by the memory controller; collecting, by the memory, information on rows that are determined as row-hammer-attacked by the memory; confirming, by the memory, that the row collected by the memory controller is the same as the row collected by the memory; and resetting, by the memory, information on the row collected by the memory which is the same as the row collected by the memory controller in response to the confirmation.

In accordance with another embodiment of the present invention, a memory system includes: a memory controller including a first row hammer attack detection circuit suitable for collecting information on rows that are row-hammer-attacked, the memory controller suitable for commanding a refresh management operation to be performed on one row among the rows collected by the first row hammer attack detection circuit; and a memory including: a second row hammer attack detection circuit suitable for collecting information on rows that are row-hammer-attacked; and a comparison circuit suitable for comparing the row, on which the refresh management operation is commanded to be performed, with the rows collected by the second row hammer attack detection circuit and suitable for resetting, as a result of the comparison, a row that is the same as the row, on which the refresh management operation is commanded to be performed, among the rows collected by the second row hammer attack detection circuit.

In accordance with yet another embodiment of the present invention, a memory includes: a memory core; a row hammer attack detection circuit suitable for collecting information on rows that are row-hammer-attacked in the memory core; and a comparison circuit suitable for: comparing a row, on which a refresh management operation is commanded to be performed with the rows collected by the row hammer attack detection circuit, and resetting, as a result of the comparison, a row that is the same as the row on which the refresh management operation is commanded to be performed, among the rows collected by the row hammer attack detection circuit.

In accordance with still another embodiment of the present invention, a method for operating a memory system includes: collecting, by a memory controller, information on rows that are determined as row-hammer-attacked in a memory by the memory controller; collecting, by the memory, information on rows that are determined as row-hammer-attacked by the memory; confirming, by the memory, that the row collected by the memory controller is the same as the row collected by the memory; and notifying, by the memory, the memory controller that the row collected by the memory controller is the same as the row collected by the memory in response to the confirmation.

In accordance with still another embodiment of the present invention, a memory system includes: a memory controller including a first row hammer attack detection circuit suitable for collecting information on rows that are rowhammer-attacked, the memory controller suitable for commanding a refresh management operation to be performed on one row among the rows collected by the first row hammer attack detection circuit; and the memory including: a second row hammer attack detection circuit suitable for collecting information on rows that are row-hammer-attacked and a comparison circuit suitable for comparing the row on which the refresh management operation is commanded to be performed with the rows collected by the second row hammer attack detection circuit and suitable for notifying, as a result of the comparison, the memory controller that there is a row that is the same as the row on which the refresh management operation is commanded to be performed, among the rows collected by the second row hammer attack detection circuit.

In accordance with still another embodiment of the present invention, a memory includes: a memory core; a row hammer attack detection circuit suitable for collecting information on rows that are row-hammer-attacked in the memory core; and a comparison circuit suitable for: comparing a row on which a refresh management operation is commanded to be performed, with the rows collected by the row hammer attack detection circuit, and notifying, as a result of the comparison, the memory controller that one of the rows collected by the row hammer attack detection circuit is the same as the row on which the refresh management operation is commanded to be performed.

In accordance with still another embodiment of the present invention, a method for operating a memory system includes: collecting, by a memory controller, information on rows that are determined as row-hammer-attacked in a memory by the memory controller; collecting, by the memory, information on rows that are determined as row-hammer-attacked by the memory; confirming, by the memory, that a similarity between the row collected by the memory controller and the row collected by the memory is equal to or greater than a threshold value; and changing, by the memory, a parameter, which is related to the collecting by the memory, in response to the confirmation.

In accordance with still another embodiment of the present invention, a memory system includes: a memory controller including a first row hammer attack detection circuit suitable for collecting information on rows that are row-hammer-attacked, the memory controller suitable for commanding a refresh management operation to be performed on one row among the rows collected by the first row hammer attack detection circuit; and the memory including: a second row hammer attack detection circuit suitable for collecting information on rows that are row-hammer-attacked; and a comparison circuit suitable for detecting a similarity between the row, on which the refresh management operation is commanded to be performed, and the rows collected by the second row hammer attack detection circuit and suitable for changing, when the similarity is equal to or greater than a threshold value, an operation parameter of the second row hammer attack detection circuit.

In accordance with still another embodiment of the present invention, a memory includes: a memory core; a row hammer attack detection circuit suitable for collecting information on rows that are row-hammer-attacked in the memory core; and a comparison circuit suitable for detecting a similarity between a row, on which a refresh management operation is commanded to be performed, and the rows collected by the row hammer attack detection circuit and suitable for changing, when the similarity is equal to or greater than a threshold value, an operation parameter of the row hammer attack detection circuit.

In accordance with still another embodiment of the present invention, an operating method of a memory including plural rows, the operating method comprises: gathering internal information of candidate rows detected as a result of active operations performed on the rows; refreshing rows adjacent to a row that is selected, as a hammered row, from the internal information; and removing, from the internal information, an information piece of a selected one of the candidate rows when the information piece of the selected candidate row is identical to an externally provided information piece of an externally detected hammered row.

DETAILED DESCRIPTION

Figure 1:
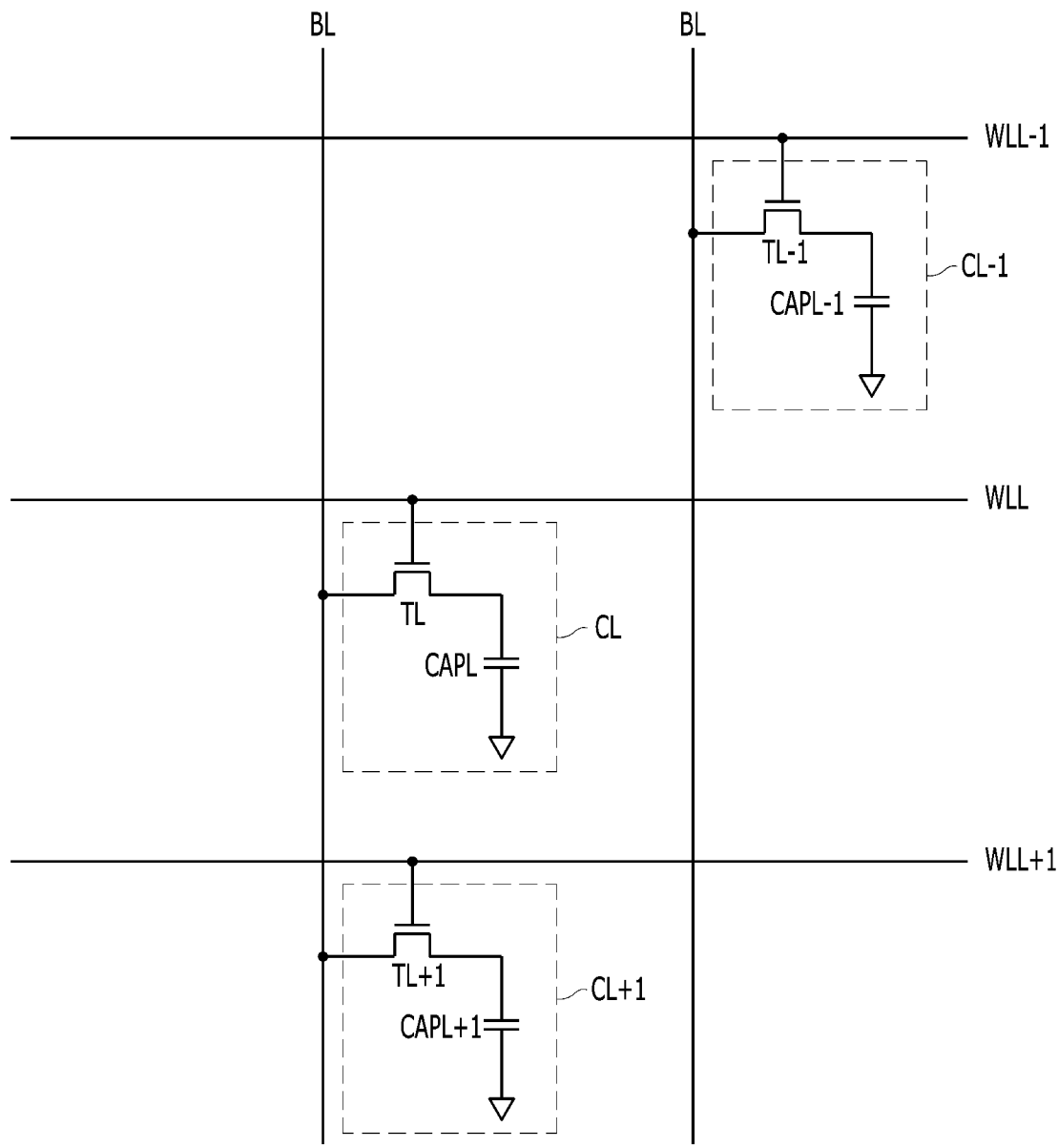
FIG. 1 is a circuit diagram illustrating a portion of a cell array included in a memory to describe row hammering.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present invention.

Figure 2:
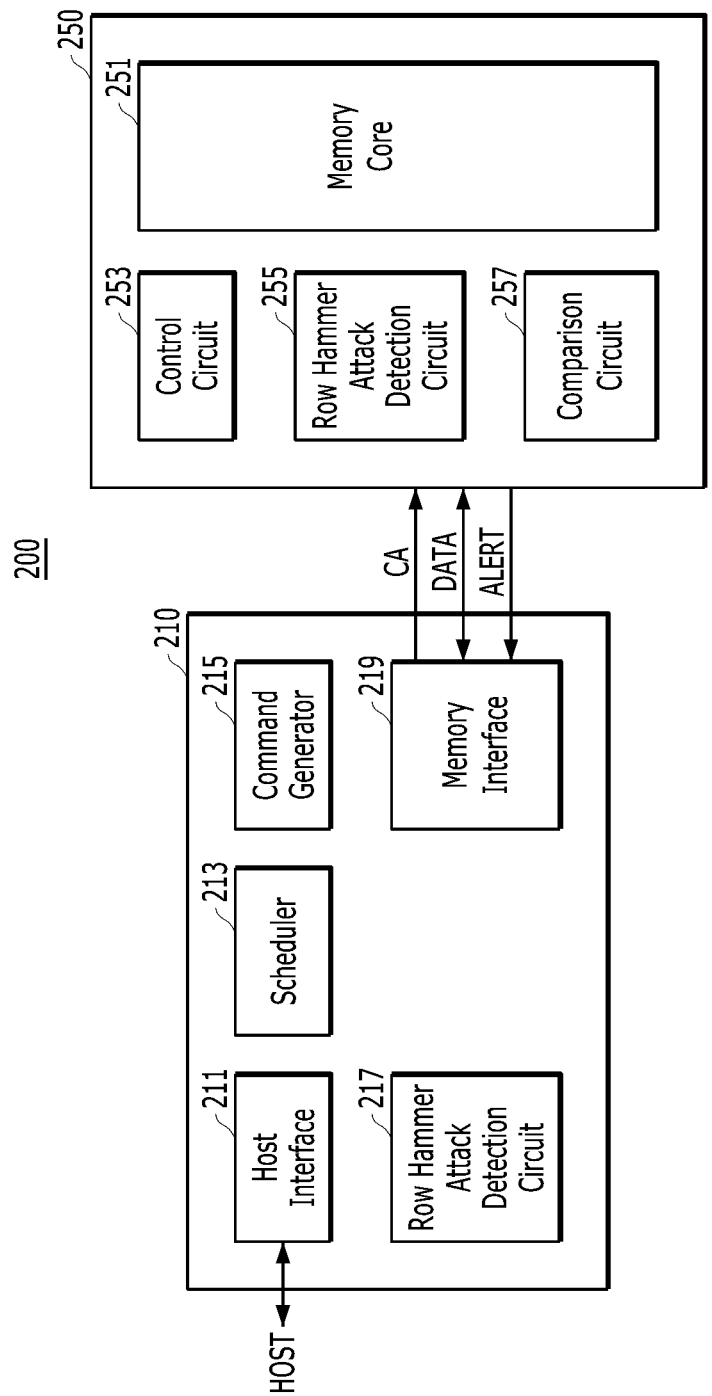
FIG. 2 is a block diagram illustrating a memory system 200 in accordance with an embodiment of the present invention.

FIG. 2 is a block diagram illustrating a memory system 200 in accordance with an embodiment of the present invention.

Referring to FIG. 2, the memory system 200 may include a memory controller 210 and a memory 250.

The memory controller 210 may control the operation of the memory 250 based on a request from a host HOST. The host HOST may include a Central Processing Unit (CPU), a Graphic Processing Unit (GPU), an Application Processor (AP), and the like. The memory controller 210 may include a host interface 211, a scheduler 213, a command generator 215, a row hammer attack detection circuit 217, and a memory interface 219. The memory controller 210 may be included in a CPU, GPU, AP, and the like. In this case, the host HOST may mean the structure other than the memory controller 210 in these structures. For example, when the memory controller 210 is included in a CPU, the host HOST of the figure may represent the constituent elements excluding the memory controller 210 in the CPU.

The host interface 211 may be for an interface between the memory controller 210 and the host HOST.

The scheduler 213 may determine the order of requests to be directed to the memory 250 among the requests from the host HOST.

In order to improve the performance of the memory 250, the scheduler 213 may make the order of the requests received from the host HOST and the order of operations to be directed to the memory 250 different from each other. For example, even though the host HOST requests a read operation of the memory 250 first and requests a write operation later, the scheduler 213 may change the order in such a manner that a write operation is performed before a read operation.

The command generator 215 may generate a command to be applied to the memory 250 according to the order of operations which is determined by the scheduler 213.

The row hammer attack detection circuit 217 may collect information on the rows that are row-hammer-attacked in the memory core 251 of the memory 250. The rows positioned adjacent to the row which is determined by the row hammer attack detection circuit 217 to be most row-hammer-attacked in the memory core 251 may be refreshed during a refresh management operation of the memory 250. For example, when the row hammer attack detection circuit 217 determines that a $73^{rd}$ row in the memory core 251 is most row-hammer-attacked, the rows positioned adjacent to the $73^{rd}$ row, which are a $72^{nd}$ row and a $74^{th}$ row, may be refreshed during a refresh management operation of the memory 250. The refresh management operation may be an operation performed in the memory 250 by the memory controller 210 applying an address to the memory 250 together with a refresh management command DRFM which may be also called a directed refresh management command DRFM. The memory 250 may refresh the rows positioned adjacent to the row which is designated by an address received from the memory controller 210. The row hammer attack detection circuit 217 may collect information on the rows that are row-hammer-attacked in the memory core 251 by using a combination of various methods, such as a method of counting the number of times that the rows of the memory core 251 are activated and a method of randomly sampling the rows that are activated in the memory core 251, and the like.

The memory interface 219 may be provided for an interface between the memory controller 210 and the memory 250. A command and an address CA may be transferred from the memory controller 210 to the memory 250 through the memory interface 219 and data DATA may be transferred/received through the memory interface 219. The memory interface 219 may also receive an alert signal ALERT from the memory 250.

The memory 250 may perform an operation directed by the memory controller 210. The memory 250 may be a memory requiring a refresh operation. For example, the memory 250 may be a Dynamic Random Access Memory (DRAM) or another type of a memory requiring a refresh operation.

The memory 250 may include a memory core 251, a control circuit 253, a row hammer attack detection circuit 255, and a comparison circuit 257.

The control circuit 253 may control the overall operation of the memory 250. The control circuit 253 may control the internal constituent elements of the memory 250 to perform operations directed by a command and an address CA, such as an active operation, a precharge operation, a read operation, a write operation, and a refresh operation. Also, when a refresh management operation is directed by the memory controller 210, the control circuit 253 may control the internal constituent elements of the memory 250 such that the rows that are positioned adjacent to the row which corresponds to the address transferred from the memory controller 210 are refreshed in the memory core 251.

The memory core 251 may include a plurality of memory cells that are arranged in a plurality of rows and a plurality of columns. Also, the memory core 251 may include circuits for writing data into the memory cells and reading data from the memory cells.

The row hammer attack detection circuit 255 may select the rows that have been row-hammer-attacked among the rows activated in the memory core 251, that is, the rows that are activated excessively many times. The rows positioned adjacent to the row which is selected by the row hammer attack detection circuit 255 may be refreshed during a smart refresh operation. Herein, a smart refresh operation may refer to an operation of refreshing the rows positioned adjacent to the row which is selected by the row hammer attack detection circuit 255 during a spare time of a normal refresh operation.

The comparison circuit 257 may compare the row selected by the row hammer attack detection circuit 217 of the memory controller 210 with the row selected by the row hammer attack detection circuit 255 of the memory 250, and when they are the same, the comparison circuit 257 may notify the memory controller 210 that they are the same. The comparison circuit 257 may be able to detect which row is selected by the row hammer attack detection circuit 217 based on the address transferred from the memory controller 210 together with a refresh management command. Therefore, the comparison circuit 257 may compare it with the row selected by the row hammer attack detection circuit 255. When the rows are the same, the alert signal ALERT may be activated and transferred from the memory 250 to the memory controller 210.

Since the row hammer attack detection circuit 217 of the memory controller 210 and the row hammer attack detection circuit 255 of the memory 250 have the same purpose of selecting a row that is row-hammer-attacked, if the rows respectively selected by the two circuits 217 and 255 are the same, it may be considered that the two circuits 217 and 255 operate correctly. However, when the two circuits 217 and 255 select the same row, a refresh management operation and a smart refresh operation may be performed on the same row, which means that the refresh operations may be performed unnecessarily twice on the same row. The two circuits 217 and 255 selecting the same row may not be a desirable situation in terms of the memory system 200. Therefore, the memory 250 may inform the memory controller 210 of the situation so that the memory controller 210 may make a corresponding response.

Figure 3:
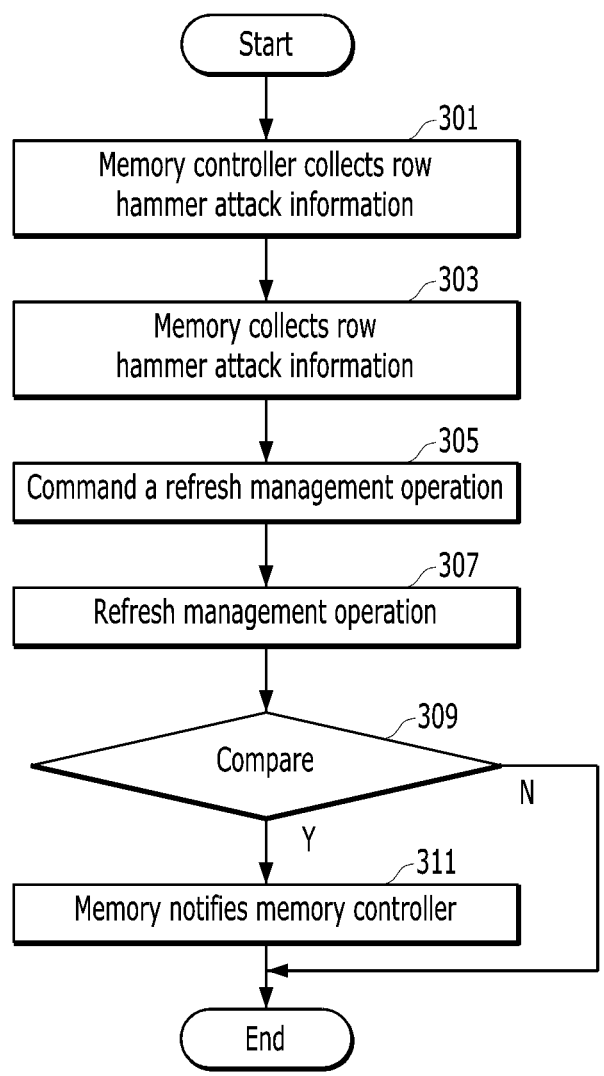
FIG. 3 is a flowchart describing an operation of the memory system 200 shown in FIG. 2 in accordance with an embodiment of the present invention.

FIG. 3 is a flowchart describing an operation of the memory system 200 shown in FIG. 2 in accordance with an embodiment of the present invention.

Referring to FIG. 3, the row hammer attack detection circuit 217 of the memory controller 210 may collect information on the rows that are row-hammer-attacked in the memory core 251 of the memory 250 in operation S301. Also, the row hammer attack detection circuit 255 of the memory 250 may also collect information on the rows that are row-hammer-attacked in the memory core 251 in operation S303. Each of the row hammer attack detection circuit 217 and the row hammer attack detection circuit 255 may independently determine a row as row-hammer-attacked in the memory core 251.

The memory controller 210 may transfer the address of the row which is selected by the row hammer attack detection circuit 217 to the memory 250 together with a Directed Refresh Management command DRFM in operation S305. That is, the memory controller 210 may direct the memory 250 to perform a refresh management operation.

A refresh management operation of the memory 250 may be performed in response to the direction of the memory controller 210 in operation S307. The rows positioned adjacent to the row which is selected by the row hammer attack detection circuit 217 in the memory core 251 may be refreshed.

The comparison circuit 257 of the memory 250 may compare the row selected by the row hammer attack detection circuit 217 which is received in the operation 305 with the row selected by the row hammer attack detection circuit 255 in operation S309.

When the row selected by the row hammer attack detection circuit 217 and the row selected by the row hammer attack detection circuit 255 are the same (Y in the operation S309), the memory 250 may notify the memory controller 210 of it in operation S311. This may be notified by the memory 250 activating an alert signal ALERT and transferring the alert signal ALERT to the memory controller 210. When the memory controller 210 receives the activated alert signal ALERT, the memory controller 210 may recognize that there is an issue with the row hammer attack detection circuit 217 and the row hammer attack detection circuit 255 selecting the same row. In this case, in order to resolve the issue, the memory controller 210 may change the operation parameters of the row hammer attack detection circuit 217.

Figure 4:
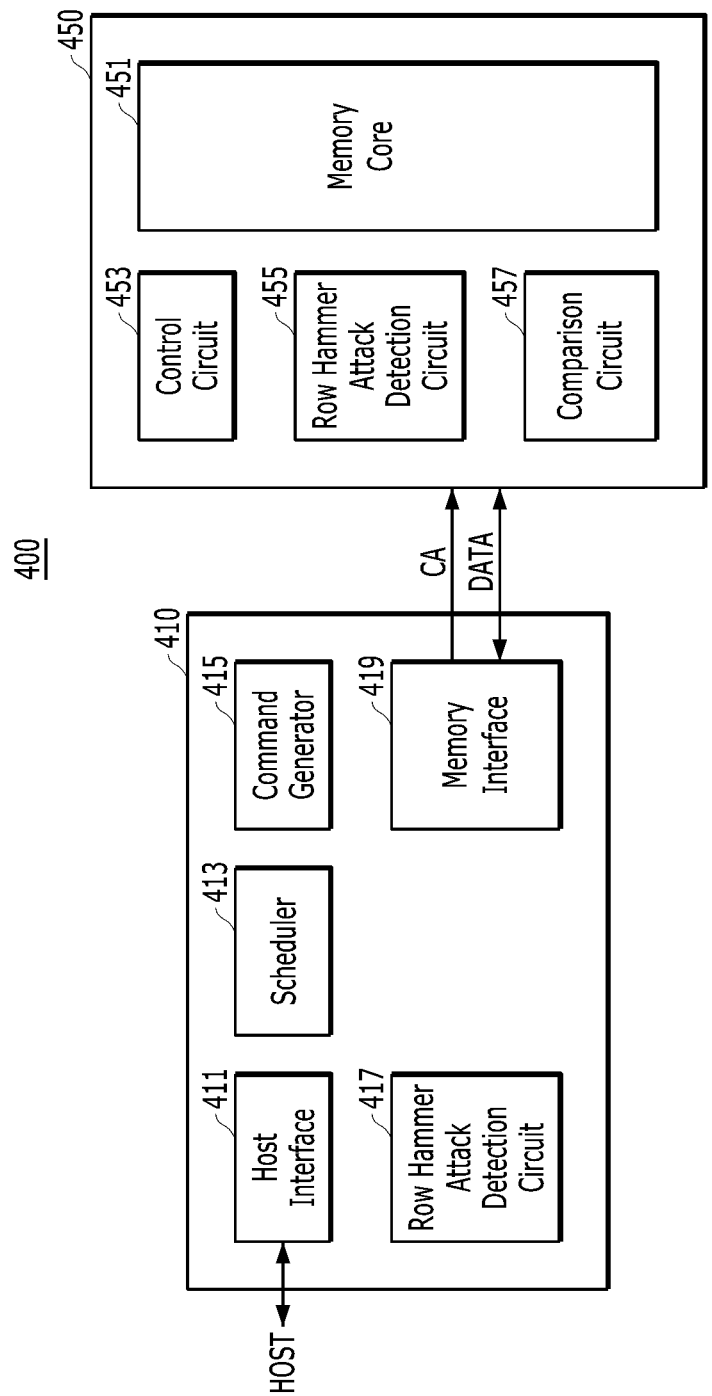
FIG. 4 is a block diagram illustrating a memory system 400 in accordance with another embodiment of the present invention.

FIG. 4 is a block diagram illustrating a memory system 400 in accordance with another embodiment of the present invention.

Referring to FIG. 4, the memory system 400 may include a memory controller 410 and a memory 450.

The memory controller 410 may include a host interface 411, a scheduler 413, a command generator 415, a row hammer attack detection circuit 417, and a memory interface 419. Since the internal constituent elements 411, 413, 415, 417, and 419 of the memory controller 410 have been described above in detail with reference to FIG. 2, detailed description thereof will be omitted herein.

The memory 450 may include a memory core 451, a control circuit 453, a row hammer attack detection circuit 455, and a comparison circuit 257.

The control circuit 453 may control the overall operation of the memory 450. The control circuit 453 may control the internal constituent elements of the memory 450 such that the memory 450 may perform the operations directed by the command and the address CA, for example, an active operation, a precharge operation, a read operation, a write operation, and a refresh operation. Also, when the memory controller 410 directs a refresh management operation, the control circuit 453 may control the internal constituent elements of the memory 450 to refresh the rows positioned adjacent to the row corresponding to the address transferred from the memory controller 410 in the memory core 451.

The memory core 451 may include a plurality of memory cells that are arranged in a plurality of rows and a plurality of columns. Also, the memory core 451 may include circuits for writing data into the memory cells and reading data from the memory cells.

The row hammer attack detection circuit 455 may collect information related to the rows that are row-hammer-attacked among the rows activated in the memory core 451. Also, the comparison circuit 457 may compare the information collected by the row hammer attack detection circuit 417 with the information collected by the row hammer attack detection circuit 455. In the embodiment of FIG. 2, although the alert signal ALERT representing the comparison result of the comparison circuit 257 is transferred from the memory 250 to the memory controller 210, in the embodiment of FIG. 4, the comparison result of the comparison circuit 457 may affect the operation of the row hammer attack detection circuit 455 instead of being notified to the memory controller 410. The row hammer attack detection circuit 455 and the comparison circuit 457 will be described in detail by referring to the following drawings.

Figure 5:
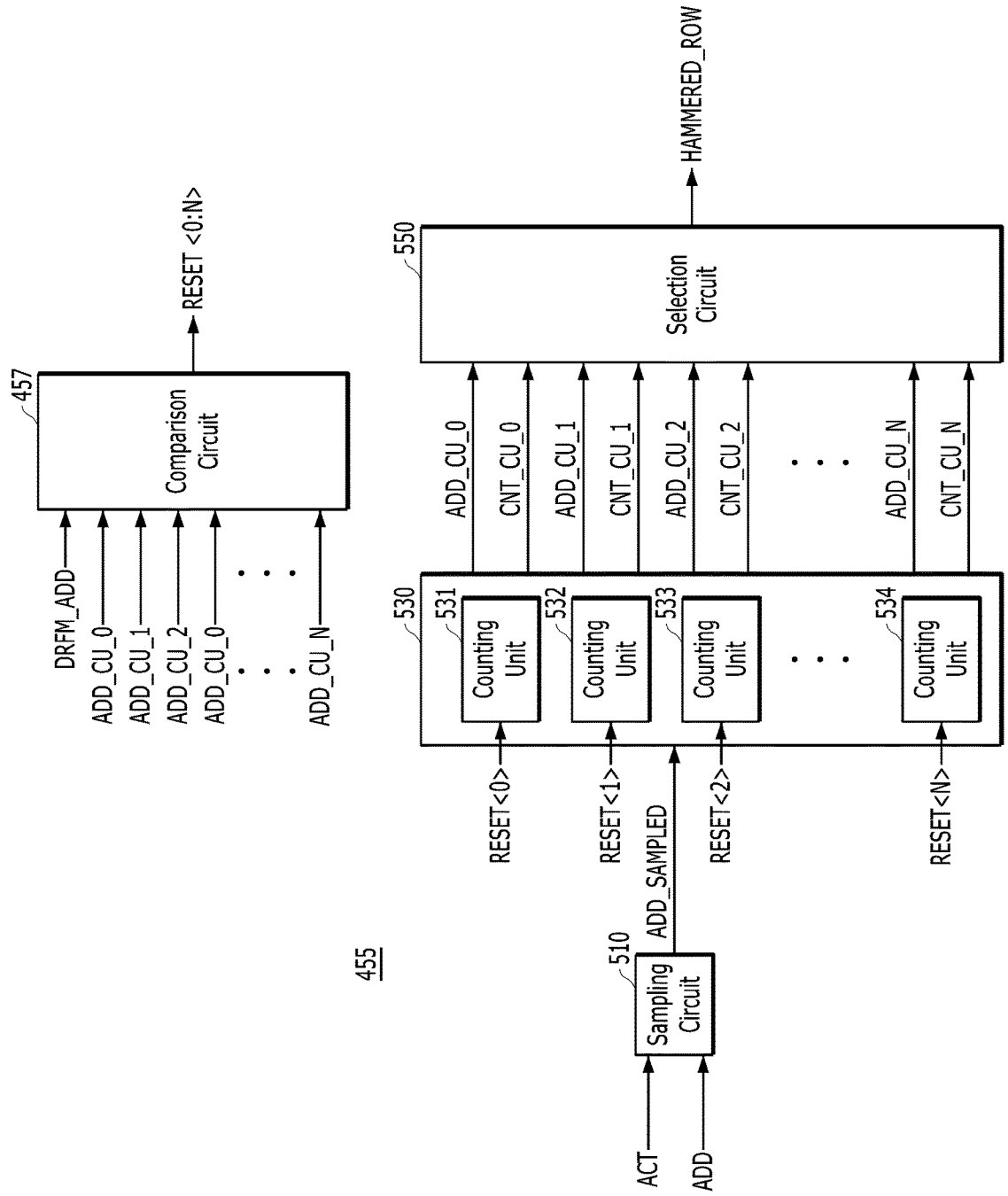
FIG. 5 is a block diagram illustrating a row hammer attack detection circuit 455 and a comparison circuit 457 shown in FIG. 4 in accordance with a first detailed embodiment of the present invention.

FIG. 5 is a block diagram illustrating the row hammer attack detection circuit 455 and the comparison circuit 457 shown in FIG. 4 in accordance with a first detailed embodiment of the present invention.

Referring to FIG. 5, the row hammer attack detection circuit 455 may include a sampling circuit 510, a counting circuit 530, and a selection circuit 550.

The sampling circuit 510 may randomly sample some of the addresses used for active operations. Since the sampling circuit 510 receives an active signal ACT and an address ADDR that are activated during an active operation, it may be possible to detect which row is activated in the memory core 451. The sampling circuit 510 may be used to reduce the area of the row hammer attack detection circuit 455. When the sampling circuit 510 is used, only a portion of the addresses used for active operations may be sampled and counted. Therefore, the entire area of the row hammer attack detection circuit 455 may be reduced.

The counting circuit 530 may count the number of active operations per row, which may be simply referred to as an active count, based on the address ADD_SAMPLED sampled by the sampling circuit 510. The counting circuit 530 may include a plurality of counting units 531 to 534. Each of the counting units 531 to 534 may count the number of active operations, i.e., the active count, of a corresponding row and store the counting result. For example, the counting unit 531 may store information of [$3^{rd}$ row, $45^{th}$ active], and the counting unit 532 may store information of [$108^{th}$ row, $80^{th}$ active]. Row addresses ADD_CU_0 to ADD_CU_N output from the counting units 531 to 534 may represent the row addresses that are stored in the corresponding counting units, and active counts CNT_CU_0 to CNT_CU_N may represent the number of active operations stored in the corresponding counting units.

The selection circuit 550 may select one among the row addresses ADD_CU_0 to ADD_CU_N that are stored in the counting circuit 530 as a hammered row HAMMERED ROW. The selection circuit 550 may select one among the row addresses ADD_CU_0 to ADD_CU_N based on the active counts CNT_CU_0 to CNT_CU_N recorded in the counting units 531 to 534. For example, a row address having the largest active count among the row addresses ADD_CU_0 to ADD_CU_N may be selected as the hammered row HAMMERED_ROW. In a smart refresh operation, the rows positioned adjacent to the hammered row HAMMERED_ROW in the memory core 251 may be refreshed. The counting unit corresponding to the row selected as the hammered row HAMMERED_ROW among the counting units 531 to 534 may be reset. For example, when the 108th row stored in the counting unit 532 is selected as the hammered row HAMMERED_ROW, the row address ADD_CU_1 and the active count CNT_CU_1 stored in the counting unit 532 may be initialized.

The comparison circuit 457 may compare the row address DRFM_ADD at which a refresh management operation is commanded to be performed with the row addresses ADD_CU_0 to ADD_CU_N stored in the counting units 531 to 534. The comparison circuit 457 may compare the row address DRFM_ADD selected by the row hammer attack detection circuit 417 of the memory controller 410 with the row addresses ADD_CU_0 to ADD_CU_N that are being collected by the row hammer attack detection circuit 455 of the memory 450. When the same address as the row address DRFM_ADD exists among the row addresses ADD_CU_0 to ADD_CU_N, the comparison circuit 457 may activate a corresponding reset signal among reset signals RESET<0:N>. For example, when the row address DRFM_ADD and the row address ADD_CU_N are the same, the comparison circuit 457 may activate the reset signal RESET<N>. When the row address DRFM_ADD and the row address ADD_CU_2 are the same, the comparison circuit 457 may activate the reset signal RESET<2>.

The counting units 531 to 534 may be reset when the reset signal corresponding to them among the reset signals RESET<0:N> is activated. For example, when the reset signal RESET<1> is activated, the row address ADD_CU_1 and the active count CNT_CU_1 stored in the counting unit 532 may be initialized. The reset counting unit may count the number of active operations, i.e., the active count, of a new row address.

The row address which is the same as the row address DRFM_ADD selected by the row hammer attack detection circuit 417 of the memory controller 410 may be erased from the row hammer attack detection circuit 455 of the memory 450 through the operation of the comparison circuit 457. Therefore, it may be possible to prevent unnecessary and redundant refresh operations from being performed.

Figure 6:
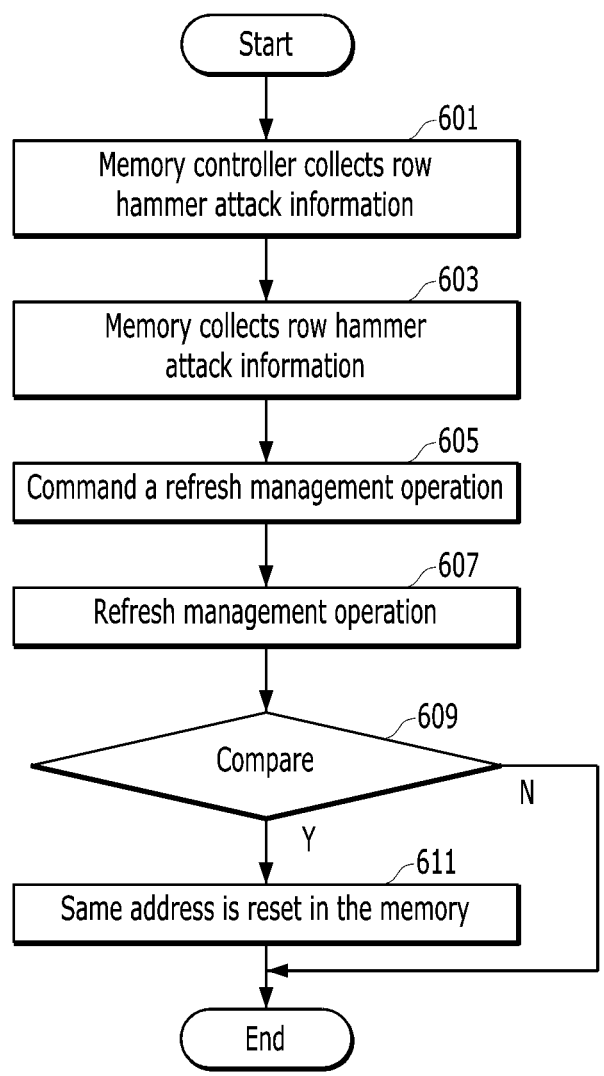
FIG. 6 is a flowchart describing an operation of the memory system 400 described with reference to FIGS. 4 and 5 in accordance with an embodiment of the present invention.

FIG. 6 is a flowchart describing an operation of the memory system 400 described with reference to FIGS. 4 and 5 in accordance with an embodiment of the present invention.

Referring to FIG. 6, the row hammer attack detection circuit 417 of the memory controller 410 may collect information on the rows that are row-hammer-attacked in the memory core 451 of the memory 450 in operation S601. Also, the row hammer attack detection circuit 455 of the memory 450 may also collect information on the rows that are row-hammer-attacked in the memory core 451 in operation S603. Each of the row hammer attack detection circuit 417 and the row hammer attack detection circuit 455 may independently determine a row as row-hammer-attacked in the memory core 451.

The memory controller 410 may transfer the address DRFM_ADD of the row which is selected by the row hammer attack detection circuit 417 to the memory 450 together with the refresh management command DRFM in operation S605. The memory controller 410 may direct the memory 450 to perform a refresh management operation.

A refresh management operation of the memory 450 may be performed in response to a direction from the memory controller 410 in operation S607. The rows positioned adjacent to the row selected by the row hammer attack detection circuit 417 in the memory core 451, that is, the row corresponding to the address DRFM_ADD may be refreshed.

The comparison circuit 457 of the memory 450 may compare the address DRFM_ADD selected by the row hammer attack detection circuit 417, which is received in the operation 605, with the addresses The ADD_CU_0 to ADD_CU_N being collected by the row hammer attack detection circuit 455 of the memory 450 in operation S609.

As a result of the comparison in operation S609 (Y in operation S609), when there is an address which is the same as the address DRFM_ADD among the addresses ADD_CU_0 to ADD_CU_N, one among the reset signals RESET<0:N> may be activated. In this case, information on the address DRFM_ADD among the addresses ADD_CU_0 to ADD_CU_N that are collected by the row hammer attack detection circuit 455 of the memory 450 may be reset in operation S611. The counting unit corresponding to the activated reset signal among the reset signals RESET<0:N> may be reset. Through the above operation, it is possible to prevent the problem of a refresh management operation, which is performed on a row collected by the row hammer attack detection circuit 417 of the memory controller 410, and a smart refresh operation, which is performed on a row collected by the row hammer attack detection circuit 455 of the memory 450, being performed on the same row redundantly.

Figure 7:
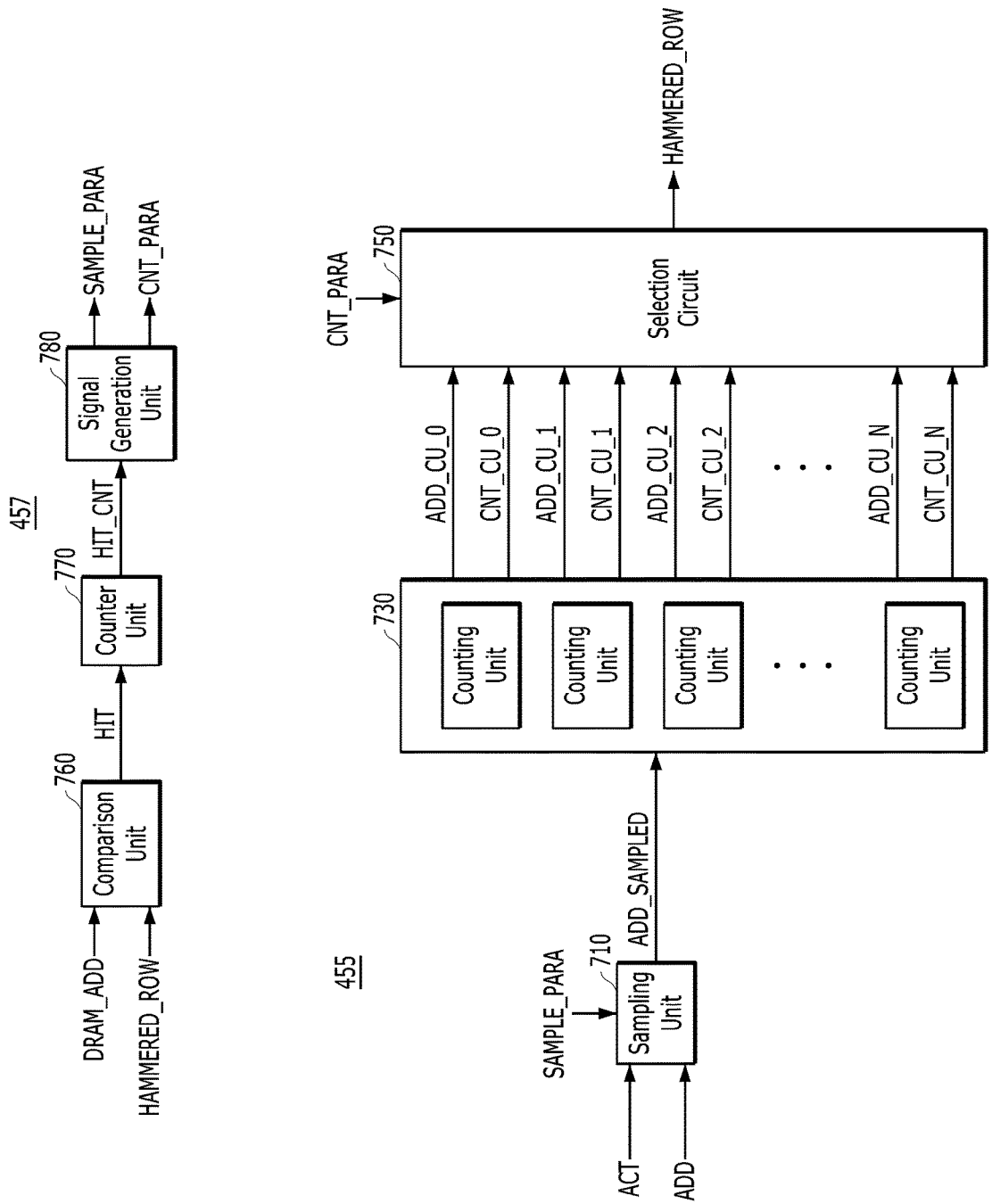
FIG. 7 is a block diagram illustrating the row hammer attack detection circuit 455 and the comparison circuit 457 shown in FIG. 4 in accordance with a second detailed embodiment of the present invention.

FIG. 7 is a block diagram illustrating the row hammer attack detection circuit 455 and the comparison circuit 457 shown in FIG. 4 in accordance with a second detailed embodiment of the present invention.

When the similarity between the row address DRFM_ADD selected by the row hammer attack detection circuit 417 and the row address HAMMERED_ROW selected by the row hammer attack detection circuit 455 is high, the comparison circuit 457 may activate a sampling parameter change signal SAMPLE_PARA and a counting parameter change signal CNT_PARA to change operation parameters of the row hammer attack detection circuit 455. The comparison circuit 457 may include a comparison unit 760, a counter unit 770, and a signal generation unit 780.

The comparison unit 760 may compare the row address DRFM_ADD selected by the row hammer attack detection circuit 417 of the memory controller 410 with the row address HAMMERED_ROW selected by the row hammer attack detection circuit 455 and, when the two addresses DRFM_ADD and HAMMERED_ROW match, the comparison unit 760 may activate a hit signal HIT.

The counter unit 770 may generate a similarity code HIT_CNT by counting the number of times that the hit signal HIT is activated. As the value of the similarity code HIT_CNT becomes higher and higher, it may mean that the two addresses DRFM_ADD and
HAMMERED_ROW are similar.

The signal generation unit 780 may activate the sampling parameter change signal SAMPLE_PARA and the counting parameter change signal CNT_PARA when the value of the similarity code HIT_CNT is equal to or greater than a threshold value. The threshold value at which the signal generation unit 780 activates the sampling parameter change signal SAMPLE_PARA and the threshold value at which the signal generation unit 780 activates the counting parameter change signal CNT_PARA may be the same or different from each other. For example, when the similarity code HIT_CNT is equal to or greater than approximately 30, the signal generation unit 780 may activate the sampling parameter change signal SAMPLE_PARA and the counting parameter change signal CNT_PARA. Also, for example, when the similarity code HIT_CNT is equal to or greater than approximately 25, the signal generation unit 780 may activate the sampling parameter change signal SAMPLE_PARA, and when the similarity code HIT_CNT is equal to or greater than approximately 35, the signal generation unit 780 may activate the counting parameter change signal CNT_PARA.

The row hammer attack detection circuit 455 may include a sampling circuit 710, a counting circuit 730, and a selection circuit 750.

The sampling circuit 710 may randomly sample a portion of the addresses that are used for active operations. Since the sampling circuit 710 receives an active signal ACT and an address ADDR that are activated during an active operation, it may be possible to detect which row is activated in the memory core 451. The sampling circuit 710 may be used to reduce the area of the row hammer attack detection circuit 455. When the sampling circuit 710 is used, only a portion of the addresses used for active operations may be sampled and counted. Therefore, the entire area of the row hammer attack detection circuit 455 may be reduced. The sampling circuit 710 may change a parameter which is related to random sampling when the sampling parameter change signal SAMPLE_PARA is activated. The sampling circuit 710 may generate a random pulse that is randomly activated and use the random pulse to randomly sample an address. The sampling circuit 710 may change a parameter related to the generation of the random pulse in response to the activation of the sampling parameter change signal SAMPLE_PARA. When the parameter related to the generation of the random pulse is changed, the period and the pulse width of the random pulse may be changed.

The counting circuit 730 may count the number of active operations per row based on the address ADD_SAMPLED which is sampled by the sampling circuit 710. The counting circuit 730 may include a plurality of counting units 731 to 734. Each of the counting units 731 to 734 may count the number of active operations, i.e., the active count, of a corresponding row and store the counting result. For example, the counting unit 731 may store information of [$3^{rd}$ row, $45^{th}$ active], and the counting unit 732 may store information of [$108^{th}$ row, $80^{th}$ active]. Row addresses ADD_CU_0 to ADD_CU_N output from the counting units 731 to 734 may represent the row addresses stored in the corresponding counting units, and active counts CNT_CU_0 to CNT_CU_N may represent the number of active operations stored in the corresponding counting units.

The selection circuit 750 may select one among the row addresses ADD_CU_0 to ADD_CU_N that are stored in the counting circuit 730 as the hammered row HAMMERED_ROW. The selection circuit 750 may select one among the row addresses ADD_CU_0 to ADD_CU_N based on the active counts CNT_CU_0 to CNT_CU_N that are recorded in the counting units 731 to 734. The selection circuit 750 may select a row address whose active count CNT_CU_0 to CNT_CU_N recorded in the counting units 731 to 734 is equal to or greater than a threshold value among the row addresses ADD_CU_0 to ADD_CU_N as the hammered row HAMMERED_ROW. When there are two or more row addresses whose active count CNT_CU_0 to CNT_CU_N recorded in the counting units 731 to 734 is equal to or greater than the threshold value among the row addresses ADD_CU_0 to ADD_CU_N, the row address having the greater active count may be selected as the hammered row HAMMERED_ROW. When there is no row address whose active count CNT_CU_0 to CNT_CU_N recorded in the counting units 731 to 734 is equal to or greater than the threshold value among the row addresses ADD_CU_0 to ADD_CU_N, there may be no hammered row. The selection circuit 750 may receive the counting parameter change signal CNT_PARA, and may change the threshold value which is used to select the hammered row HAMMERED_ROW when the counting parameter change signal CNT_PARA is activated.

Figure 8:
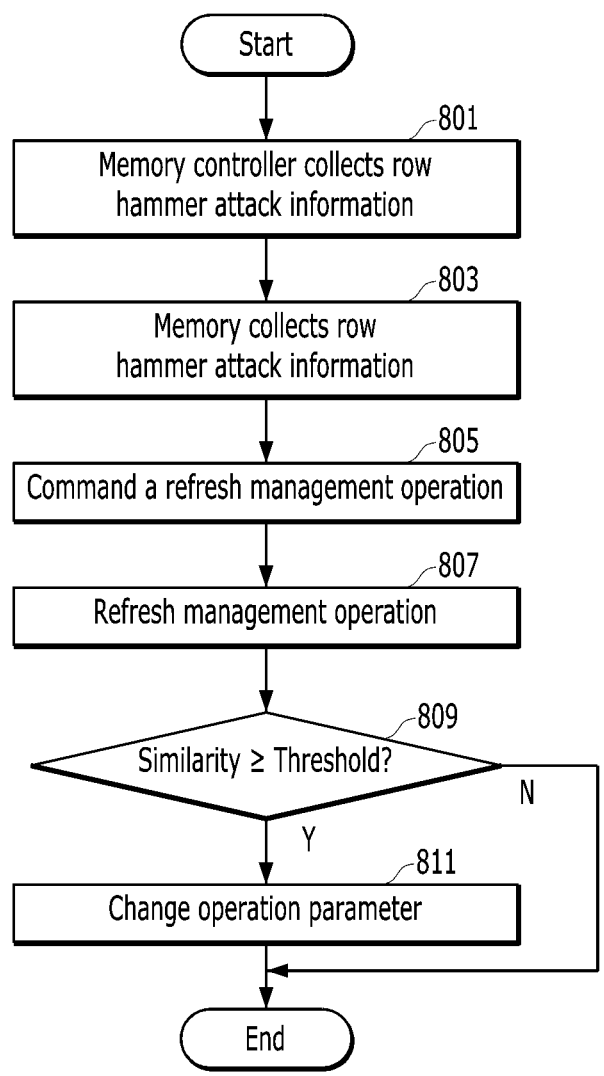
FIG. 8 is a flowchart describing an operation of the memory system 400 which is described with reference to FIGS. 4 and 7 in accordance with an embodiment of the present invention.

FIG. 8 is a flowchart describing an operation of the memory system 400 which is described with reference to FIGS. 4 and 7 in accordance with an embodiment of the present invention.

Referring to FIG. 8, the row hammer attack detection circuit 417 of the memory controller 410 may collect information on the rows that are row-hammer-attacked in the memory core 451 of the memory 450 in operation S801. Also, the row hammer attack detection circuit 455 of the memory 450 may collect information on the rows that are row-hammer-attacked in the memory core 451 in operation S803. Each of the row hammer attack detection circuit 417 and the row hammer attack detection circuit 455 may independently determine a row as row-hammer-attacked in the memory core 451.

The memory controller 410 may transfer the address DRFM_ADD of the row which is selected by the row hammer attack detection circuit 417 together with the refresh management command DRFM to the memory 450 in operation S805. The memory controller 410 may direct the memory 450 to perform a refresh management operation.

A refresh management operation of the memory 450 may be performed in response to the direction of the memory controller 410 in operation S807. The rows positioned adjacent to the row selected by the row hammer attack detection circuit 417 in the memory core 451, that is, the row corresponding to the address DRFM_ADD may be refreshed.

The comparison circuit 457 may check whether the similarity between the rows collected by the row hammer attack detection circuit 417 of the memory controller 410 and the rows collected by the row hammer attack detection circuit 455 of the memory 450 are equal to or greater than a threshold value in operation S809. That is, it may be checked whether the value of the similarity code HIT_CNT<0:A> generated by the counter unit 770 is equal to or greater than the threshold value.

When the similarity is equal to or greater than the threshold (Y in the operation S809), the operation parameter of the row hammer attack detection circuit 455 may be changed in operation S811. In response to the activation of the sampling parameter change signal SAMPLE_PARA, a parameter related to random sampling of the row hammer attack detection circuit 455 may be changed, and in response to the activation of the counting parameter change signal CNT_PARA, a parameter related to the counting operation of the row hammer attack detection circuit 455 may be changed.

When the similarity between the rows collected by the row hammer attack detection circuit 417 of the memory controller 410 and the rows collected by the row hammer attack detection circuit 455 of the memory 450 is large, the similarity between the rows collected by the row hammer attack detection circuit 417 and the rows collected by the row hammer attack detection circuit 455 of the memory 450 may be reduced by changing the operation parameter of the row hammer attack detection circuit 455 through the operation described above.

According to an embodiment of the present invention, it is possible to increase a defending capability of a memory against row hammer attacks.

The effects desired to be obtained in the embodiments of the present invention are not limited to the effects mentioned above, and other effects not mentioned above may also be clearly understood by those of ordinary skill in the art to which the present invention pertains from the description above.

While the present invention has been described with respect to specific embodiments, it will be apparent to those skilled in the art that various changes and modifications may be made without departing from the spirit and scope of the invention as defined in the following claims.

What is claimed is:

1. A memory system comprising:
a memory controller including a first row hammer attack detection circuit suitable for collecting row hammer count information on rows that are row-hammer-attacked, the memory controller suitable for commanding a refresh management operation to be performed on a row among the rows; and
a memory including:
a second row hammer attack detection circuit suitable for collecting the row hammer count information on rows that are row-hammer-attacked, the row hammer count information including a row address in the memory and a number of times the row address was activated; and
a comparison circuit suitable for comparing the row, on which the refresh management operation is commanded to be performed, with the rows collected by the second row hammer attack detection circuit and suitable for erasing, as a result of the comparison, the row hammer count information on a row that is the same as the row on which the refresh management operation is commanded to be performed, among the rows collected by the second row hammer attack detection circuit.

2. The memory system of claim 1,
wherein the second row hammer attack detection circuit includes a plurality of counting units respectively suitable for counting and storing active counts of a plurality of rows, and
wherein a comparison circuit erases the row hammer count information on the row by resetting a counting unit corresponding to the row on which the refresh management operation is commanded to be performed, among the counting units.

3. The memory system of claim 1,
wherein the memory further includes a memory core, and
wherein the memory is suitable for refreshing rows in the memory core positioned adjacent to the row on which the refresh management operation is commanded to be performed.

4. A memory comprising:
a memory core;
a row hammer attack detection circuit suitable for collecting row hammer count information on rows that are row-hammer-attacked in the memory core, the row hammer count information including a row address in the memory core and a number of times the row address was activated; and
a comparison circuit suitable for:
comparing a row, on which a refresh management operation is commanded to be performed, with the rows collected by the row hammer attack detection circuit, and
erasing, as a result of the comparison, the row hammer count information on a row that is the same as the row on which the refresh management operation is commanded to be performed, among the rows collected by the row hammer attack detection circuit.

5. The memory of claim 4,
wherein the row hammer attack detection circuit includes a plurality of counting units respectively suitable for counting and storing active counts of a plurality of rows, and
wherein the comparison circuit erases the row hammer count information on the row by resetting a counting unit corresponding to the row on which the refresh management operation is commanded to be performed, among the counting units.

6. The memory of claim 4, wherein the memory is suitable for refreshing rows positioned adjacent to the row in the memory core on which the refresh management operation is commanded to be performed.

7. A memory system comprising:
a memory controller including a first row hammer attack detection circuit suitable for collecting row hammer count information on rows that are row-hammer-attacked, the row hammer count information including a row address in a memory and a number of times the row address was activated, the memory controller suitable for commanding a refresh management operation to be performed on a row among the rows; and
a memory including:
a second row hammer attack detection circuit suitable for collecting the row hammer count information on rows that are row-hammer-attacked and
a comparison circuit suitable for comparing the row, on which the refresh management operation is commanded to be performed, with the rows collected by the second row hammer attack detection circuit and suitable for notifying, as a result of the comparison, the memory controller that there is a row that is a same as the row, on which the refresh management operation is commanded to be performed, among the rows collected by the second row hammer attack detection circuit.

8. The memory system of claim 7,
wherein the memory further includes a memory core, and
wherein the memory is suitable for refreshing rows in the memory core positioned adjacent to the row on which the refresh management operation is commanded to be performed.

9. A memory comprising:
a memory core;
a row hammer attack detection circuit suitable for collecting row hammer count information on rows that are row-hammer-attacked in the memory core, the row hammer count information including a row address in the memory core and a number of times the row address was activated; and
a comparison circuit suitable for:
comparing a row, on which a refresh management operation is commanded to be performed, with the rows collected by the row hammer attack detection circuit, and
notifying, as a result of the comparison, a memory controller that one of the rows collected by the row hammer attack detection circuit is a same as the row on which the refresh management operation is commanded to be performed.

10. The memory of claim 9, wherein the memory is suitable for refreshing rows positioned adjacent to the row in the memory core, on which the refresh management operation is commanded to be performed.

11. A memory system, comprising:
a memory controller including a first row hammer attack detection circuit suitable for collecting row hammer count information on rows that are row-hammer-attacked, the row hammer count information including a row address in a memory and a number of times the row address was activated, the memory controller suitable for commanding a refresh management operation to be performed on a row among the rows; and
a memory including:
a second row hammer attack detection circuit suitable for collecting the row hammer count information on rows that are row-hammer-attacked; and
a comparison circuit suitable for detecting a similarity between the row, on which the refresh management operation is commanded to be performed, and the rows collected by the second row hammer attack detection circuit and suitable for changing, when the similarity is equal to or greater than a threshold value, an operation parameter of the second row hammer attack detection circuit.

12. The memory system of claim 11,
wherein the memory further includes a memory core, and
wherein the memory is suitable for refreshing rows positioned adjacent to the row, on which the refresh management operation is commanded to be performed, in the memory core.

13. The memory system of claim 11,
wherein the second row hammer attack detection circuit operates through a random sampling method, and
wherein the operation parameter is related to the random sampling method.

14. The memory system of claim 11,
wherein the second row hammer attack detection circuit operates through a counting method, and
wherein the operation parameter is related to the counting method.

15. A memory comprising:
a memory core;
a row hammer attack detection circuit suitable for collecting row hammer count information on rows that are row-hammer-attacked in the memory core, the row hammer count information including a row address in the memory core and a number of times the row address was activated; and
a comparison circuit suitable for detecting a similarity between a row, on which a refresh management operation is commanded to be performed, and the rows collected by the row hammer attack detection circuit and suitable for changing, when the similarity is equal to or greater than a threshold value, an operation parameter of the row hammer attack detection circuit.

16. The memory of claim 15, wherein the memory is suitable for refreshing rows positioned adjacent to the row on which the refresh management operation is commanded to be performed, in the memory core.

17. The memory of claim 15,
wherein the row hammer attack detection circuit operates through a random sampling method, and
wherein the operation parameter is related to the random sampling method.

18. The memory of claim 15,
wherein the row hammer attack detection circuit operates through a counting method, and
wherein the operation parameter is related to the counting method.

19. A method for operating a memory system, comprising:
collecting, by a first row hammer attack detection circuit of a memory controller, row hammer count information on rows in a memory that are determined as row-hammer-attacked by the memory controller, the row hammer count information including a row address in the memory and a number of times the row address was activated;
collecting, by a second row hammer attack detection circuit of the memory, the row hammer count information on the rows in the memory that are determined as row-hammer-attacked by the memory;
confirming, by the memory, that the row hammer count information collected by the memory controller and the row hammer count information collected by the memory are for a same row determined as row-hammer-attacked; and
erasing, by the memory, the row hammer count information on the same row, collected by the memory, in response to the confirmation that the row hammer count information collected by the memory controller and the row hammer count information collected by the memory are for the same row determined as row-hammer-attacked.

20. The method of claim 19, further comprises:
transferring, by the memory controller, to the memory, an address of the rows on which the row hammer count information is collected by the memory controller, together with a refresh management command; and
refreshing, by the memory, rows positioned adjacent to the row transferred from the memory controller to the memory.

21. A method for operating a memory system, comprising:
collecting, by a memory controller, row hammer count information on rows that are determined as row-hammer-attacked in a memory by the memory controller, the row hammer count information including a row address in the memory and a number of times the row address was activated;
collecting, by the memory, the row hammer count information on rows that are determined as row-hammer-attacked by the memory;
confirming, by the memory, that the row hammer count information collected by the memory controller and the row hammer count information collected by the memory are for a same row; and
notifying, by the memory, the memory controller that the memory has the row hammer count information for the same row according to the confirmation.

22. The method of claim 21, further comprises:
transferring, by the memory controller, to the memory, an address of the rows on which the row hammer count information is collected by the memory controller, together with a refresh management command; and
refreshing, by the memory, rows positioned adjacent to the row transferred from the memory controller.

23. A method for operating a memory system, comprising:
collecting, by a memory controller, row hammer count information on rows that are determined as row-hammer-attacked in a memory by the memory controller, the row hammer count information including a row address in the memory and a number of times the row address was activated;

collecting, by the memory, the row hammer count information on rows that are determined as row-hammer-attacked by the memory;

confirming, by the memory, that a similarity between the rows collected by the memory controller and the rows collected by the memory is equal to or greater than a threshold value; and changing, by the memory, a parameter, which is related to the collecting by the memory, according to the confirmation.

24. The method of claim 23,
wherein the information is collected by the memory through a random sampling method, and
wherein the parameter includes a sampling parameter related to the random sampling method.

25. The method of claim 23,
wherein the row hammer count information is collected by the memory through a counting method, and
wherein the parameter includes a parameter related to the counting method.

26. The method of claim 23, further comprises:
transferring, by the memory controller, to the memory, an address of a row collected by the memory controller together with a refresh management command;

refreshing, by the memory, rows positioned adjacent to the row of which the address is transferred from the memory controller; and increasing, by the memory, a similarity value when the row of which the address is transferred from the memory controller is a same as one row among rows collected by the memory.

27. An operating method of a memory including plural rows, the operating method comprising:
gathering internal row hammer count information of candidate rows detected as a result of active operations performed on the rows, the internal row hammer count information including a row address in the memory and a number of times the row address was activated;

refreshing rows adjacent to a row that is selected, as a hammered row, from the internal row hammer count information; and removing, from the internal row hammer count information, an information piece of a selected one of the candidate rows when the information piece of the selected candidate row is identical to an externally provided information piece of an externally detected hammered row.

* * * * *